(12) United States Patent
Ha et al.

(10) Patent No.: US 10,742,009 B2
(45) Date of Patent: Aug. 11, 2020

(54) POWER DISTRIBUTION BOX EQUIPPED WITH RESISTIVE LEAKAGE CURRENT DETECTOR

(71) Applicant: TOZZTECH CO., LTD., Anyang-si (KR)

(72) Inventors: Hyeon Jin Ha, Seoul (KR); Hak Su Oh, Incheon (KR); Hyun Do Lee, Suwon-si (KR); Kook Wang Noh, Siheung-si (KR); Dong Woo Kim, Seoul (KR)

(73) Assignee: TOZZTECH CO., LTD., Anyang-si (KR)

( * ) Notice: Subject to any disclaimer, the term of this patent is extended or adjusted under 35 U.S.C. 154(b) by 215 days.

(21) Appl. No.: 16/117,716

(22) Filed: Aug. 30, 2018

(65) Prior Publication Data

US 2019/0081466 A1 Mar. 14, 2019

(30) Foreign Application Priority Data

Sep. 8, 2017 (KR) .................. 10-2017-0115290

(51) Int. Cl.
*H02G 3/08* (2006.01)
*G01R 31/50* (2020.01)
(Continued)

(52) U.S. Cl.
CPC .......... *H02G 3/081* (2013.01); *G01R 19/165* (2013.01); *G01R 31/50* (2020.01);
(Continued)

(58) Field of Classification Search
CPC .......... H02G 3/081; H02G 3/14; G01R 31/50; G01R 19/165; G01R 21/1271;
(Continued)

(56) References Cited

U.S. PATENT DOCUMENTS

| 2007/0069715 | A1* | 3/2007 | Bruno | G01R 21/133 |
| | | | | 324/76.11 |
| 2011/0131793 | A1* | 6/2011 | Woodbury | H02B 1/048 |
| | | | | 29/592.1 |
| 2016/0301201 | A1* | 10/2016 | Hahn | H02H 3/33 |

FOREIGN PATENT DOCUMENTS

| KR | 100463605 | 12/2004 |
| KR | 100469063 | 2/2005 |

(Continued)

*Primary Examiner* — Gary L Laxton
(74) *Attorney, Agent, or Firm* — Cantor Colburn LLP

(57) ABSTRACT

Provided is a power distribution box distributing commercial electric power supplied from lead-in electric power lines into branch electric power sources and supplying the branch electric power sources to respective loads connected thereto. More particularly, the present invention relates to a power distribution box equipped with a resistive leakage current detector extracting a resistive leakage current simply and accurately from a resultant leakage current and causing leakage current interruption and alarm to be actuated according to the extraction result. The power distribution box equipped with the resistive leakage current detector of the present invention includes: a zero-phase current transformer detecting a resultant leakage current; a voltage detector detecting voltage of branch lines; a power calculator calculating wasted power; a phase difference calculator calculating a phase difference; and a resistive leakage current extractor extracting a resistive leakage current, wherein the power calculator calculates apparent and effective power.

3 Claims, 6 Drawing Sheets

(51) Int. Cl.
  *H02B 1/20*     (2006.01)
  *H02B 1/26*     (2006.01)
  *H02G 3/14*     (2006.01)
  *G01R 19/165*   (2006.01)
  *H02H 3/32*     (2006.01)
  *H01H 71/02*    (2006.01)
  *H02B 1/48*     (2006.01)
  *H02H 3/33*     (2006.01)
  *H02B 1/03*     (2006.01)
  *H01H 83/02*    (2006.01)
  *G01R 21/127*   (2006.01)
  *H01H 83/18*    (2006.01)

(52) U.S. Cl.
  CPC .......... *H01H 71/0207* (2013.01); *H02B 1/20* (2013.01); *H02B 1/26* (2013.01); *H02B 1/48* (2013.01); *H02G 3/14* (2013.01); *H02H 3/32* (2013.01); *H02H 3/33* (2013.01); *G01R 21/1271* (2013.01); *H01H 71/0214* (2013.01); *H01H 83/02* (2013.01); *H01H 83/18* (2013.01); *H02B 1/03* (2013.01)

(58) Field of Classification Search
  CPC .......... H01H 71/0207; H01H 71/0214; H01H 83/02; H01H 83/18; H02B 1/20; H02B 1/26; H02B 1/48; H02B 1/03; H02H 3/32; H02H 3/33
  See application file for complete search history.

(56) References Cited

FOREIGN PATENT DOCUMENTS

| | | |
|---|---|---|
| KR | 200431486 | 11/2006 |
| KR | 100779233 | 12/2007 |
| KR | 101090558 | 12/2011 |
| KR | 101358050 | 2/2014 |

* cited by examiner

POWER DISTRIBUTION BOX EQUIPPED WITH RESISTIVE LEAKAGE CURRENT DETECTOR

BACKGROUND OF THE INVENTION

Field of the Invention

The present invention relates to a power distribution box distributing commercial electric power supplied from lead-in electric power lines into branch electric power sources and supplying the branch electric power sources to respective loads connected thereto. More particularly, the present invention relates to a power distribution box equipped with a resistive leakage current detector extracting a resistive leakage current simply and accurately from a resultant leakage current and causing leakage current interruption and alarm to be actuated according to the extraction result.

Description of the Related Art

Electric power entering into a building is supplied to the inside of the building through a power distribution box, wherein the power distribution box supplied with a predetermined amount of power supply from a switchboard is provided with switches for each branch circuit at a place where branch circuits are separated from the main lines in the indoor wiring. The power distribution box is a device by which the power supply is appropriately distributed to and blocked from various loads such as electric lighting, electric heating, electric power loads, and so on of houses, offices of buildings, or plants.

As shown in Korean Utility Model Registration No. 20-0431486 "Main circuit breaker for cabinet", Korean Patent No. 10-1090558 "Distributing board", Korean Patent No. 10-0779233 "Cabinet panel for distributing electric power", and the like, the power distribution box includes: a main circuit breaker connected to lead-in power supply lines to which commercial power is supplied, and a plurality of branch circuit breakers each connected to power supply branch lines providing branched power supply to respective loads.

The branch circuit breaker cuts off the power when leakage current of no less than a fixed magnitude is detected, thereby preventing electric accidents such as an electric shock and short circuit fire.

Currently, Korea uses a 60 Hz alternating current as a commercial power source, wherein the alternating current consists of a resistive current and a capacitive current depending on a phase.

Generally, a zero-phase current transformer (ZCT) is used to measure the leakage current. When the ZCT is used, it is measured in a form of a resultant leakage current combined by the resistive current flowing to the ground through the ground insulation resistance and the capacitive current flowing to the ground due to the capacitance of the line.

Out of these, the resistive leakage current is the cause of electric safety accidents such as an overcurrent and a short circuit.

However, a general branch circuit breaker does not distinguish between a resistive leakage current and a capacitive leakage current and judges whether the leakage current is excessive or not based on a magnitude of the resultant leakage current. Accordingly, currents are frequently mistaken for dangerous levels when the capacitive leakage current not affecting the electric safety is large while the resistive leakage current is even low. Particularly, in the case of branch circuit breakers used in industrial facilities, when a short circuit trips the branch circuit breaker, it is necessary to restart the industrial facility after stopping operation and confirming the electric safety thereof. Accordingly, misjudging a short circuit is costly.

In some branch circuit breakers, the leakage current and voltage are respectively detected in the branch lines, the phase difference is calculated by comparing the detected leakage current and voltage, and the resistive leakage current is extracted using the calculated phase difference. However, the accuracy of the phase difference calculated in a comparison process is low. Accordingly, there is a case where interruption of the leakage current does not occur even when the resistive leakage current actually reaches a level at which the power supply should be cut off.

SUMMARY OF THE INVENTION

Accordingly, the present invention has been made to solve above problems occurring in a power distribution box according to a conventional art, and the present invention is intended to propose a power distribution box equipped with a resistive leakage current detector. The power distribution box determines whether a short circuit is present or not by extracting the resistive leakage current from the resultant leakage current, thereby preventing a malfunction of the branch circuit breaker (ground fault circuit-interrupter breaker) from occurring, wherein extraction of the resistive leakage current is simply and exactly performed.

In addition, another object of the present invention is to provide a power distribution box equipped with a resistive leakage current detector having a main circuit breaker, branch circuit breakers, an electric meter, and the like to be easily and quickly installed on or dismantled from an enclosure.

In order to achieve the above object, the power distribution box equipped with the resistive leakage current detector includes:

a main circuit breaker supplied with commercial power;

a plurality of branch circuit breakers connected to respective loads and applying the power supplied from the main circuit breaker to corresponding loads;

a current detector detecting a resultant leakage current of branch lines connected to the branch circuit breaker;

a voltage detector detecting voltage of the branch lines;

a power calculator calculating the power using the resultant leakage current of the current detector and the voltage of the voltage detector;

a phase difference calculator calculating a phase difference using power components of the power calculator; and a resistive leakage current extractor extracting a resistive leakage current from the resultant leakage current of the current detector using the phase difference of the phase difference calculator, wherein the power calculator calculates:

apparent power by multiplying the resultant leakage current and the voltage after converting a (−) component of the resultant leakage current of the current detector and a (−) component of the voltage of the voltage detector into a (+) component of opposite direction, respectively, and effective power by multiplying the resultant leakage current and the voltage after removing the (−) component of the resultant leakage current of the current detector and the (−) component of the voltage of the voltage detector.

In addition, the power distribution box further includes:

a bracket mounted with the main circuit breaker, the branch circuit breakers, and the electric meter;

a casing enclosing the bracket, a door openably covering an opening of the casing; and an enclosure including a transparent window provided on the door and allowing the inside of the casing to be seen therethrough.

Furthermore, the power distribution box further includes:

an engaging plate provided on both sides of the bracket in the forward and backward directions;

an engaging block coupled to both side inner walls of the casing;

a guide groove formed in the front and rear directions on the surface of the engaging block and becoming deeper toward the rear;

an engaging ball moving along the guide groove;

a cover covering the engaging block; and an engaging device that is operated such that when the engaging plate enters into a gap between the engaging block and the cover and moves rearward, the engaging ball is brought into contact with the engaging plate and pushed rearward along the guide groove, thereby allowing the engaging plate to advance, and when the engaging plate moves forward, the engaging ball brought into contact with the engaging plate moves forward along the guide groove, thereby allowing the engaging plate not to move backwards by pressing the surface of the engaging plate.

Due to the power distribution box equipped with the resistive leakage current detector according to the present invention, it is possible to prevent the branch circuit breaker from misoperation due to overestimation or not operation due do underestimation of the leakage current by simply and accurately extracting the resistive leakage current from the resultant leakage current.

Furthermore, the main circuit breaker and the branch circuit breakers are mounted on a separate same bracket that can be easily and quickly assembled into or separated from the enclosure by an engaging device, whereby work such as installation and maintenance of the power distribution box is very convenient.

BRIEF DESCRIPTION OF THE DRAWINGS

The above and other objects, features and other advantages of the present invention will be more clearly understood from the following detailed description when taken in conjunction with the accompanying drawings, in which.

Figure 1:
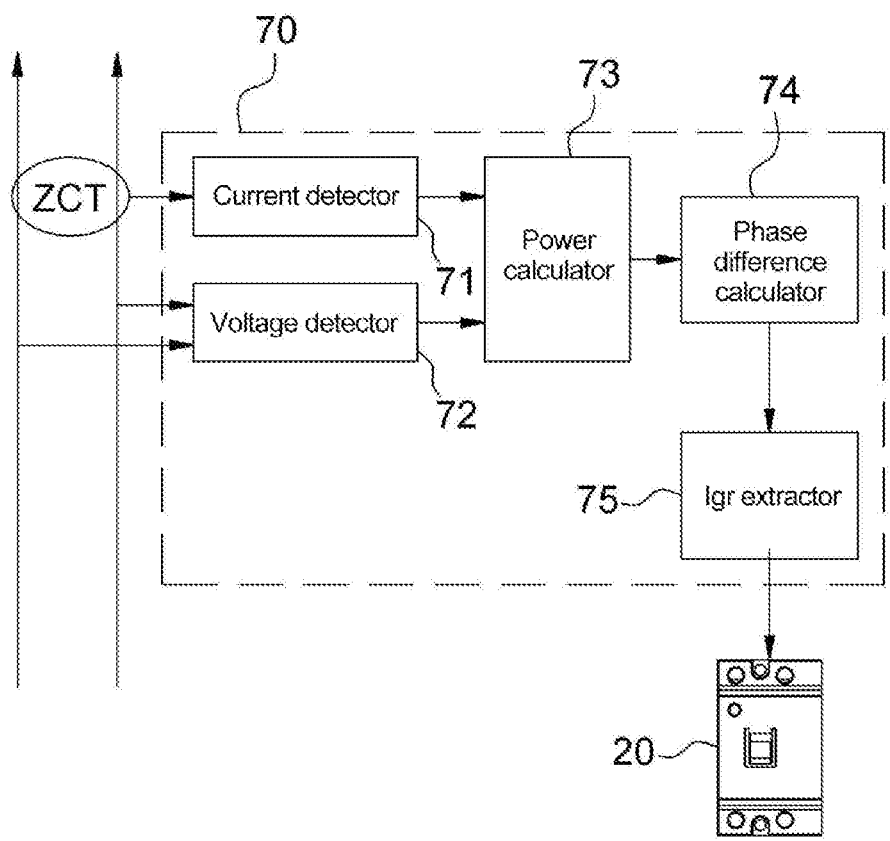
FIG. 1 is a block diagram of a power distribution box equipped with a resistive leakage current detector according to an embodiment of the present invention.

[Description of the Reference Numerals in the Drawings]

| | |
|---|---|
| 10: main circuit breaker | 20: Branch circuit breaker |
| 30: Busbar | 40: Electric meter |
| 50: Enclosure | 51: Casing |
| 53: Door | 57: Bracket |

[Description of the Reference Numerals in the Drawings]

| | |
|---|---|
| 60: Engaging device | 61: Engaging plate |
| 62: Engaging block | 63: Guide groove |
| 64: Engaging ball | 65: Cover |
| 66: Depth adjustment plate | 67: Inclined block |
| 70: Resistive leakage current detector | |
| 71: Current detector | |
| 72: Voltage detector | 73: Power calculator |
| 74: Phase difference calculator | |
| 75: Resistive leakage current extractor | |

DETAILED DESCRIPTION OF THE INVENTION

Hereinafter, a power distribution box equipped with a resistive leakage current detector according to the present invention will be described in detail with reference to the drawings.

Prior to describing the power distribution box equipped with the resistive leakage current detector of the present invention in more detail, as the present invention can be added with various modifications and have various forms, embodiments (or aspects) will be described in detail in the following text. It should be understood, however, that the invention is not intended to be limited to the particular forms disclosed, but includes all modifications, equivalents, and alternatives falling within the spirit and scope of the present invention.

In the drawings, the same reference numerals, particularly, same reference numerals which have same tens digit and ones digit, or tens digit, ones digit, and letter are used for representing member of framework having the same or similar function. Unless otherwise noted, a member of framework referred to by each reference numeral may be identified as the member corresponding to this standard.

In addition, the components in each drawing may be expressed exaggeratingly larger (or thicker) or smaller (or thinner) in size or thickness, or by simplified structure thereof, in consideration of the convenience of understanding, but it should not be construed the scope of the protection of the present invention is limited thereby.

It is to be understood that the terms used in the present patent specification are for the purpose of describing only particular embodiments (or aspects) and are not intended to limit the present invention. An expression in a singular form includes an expression in a plural form, unless the meaning is not obviously different contextually.

It should be understood that terms such as "include" or "composed" in the present invention are intended to designate the existence of a characteristic, numeral, step, movement, constituent, parts, or combination of these and should be understood not to exclude in advance the existence or a possibility of addition of at least one of other characteristics, numerals, steps, movements, constituents, parts, or combination of these.

Unless otherwise defined, all terms used herein, including technical or scientific terms, have the same meaning as commonly understood by a person having ordinary knowledge in the art to which the present invention pertains. Terms such as those defined in commonly used dictionaries should be interpreted as having a meaning consistent with the meaning in the context of the relevant art and should not be interpreted as ideal or overly formal in meaning unless explicitly defined in the present application.

As shown in the drawings, the power distribution box equipped with the resistive leakage current detector according to the present invention includes a main circuit breaker 10, branch circuit breakers 20, busbars 30, an electric meter 40, an enclosure 50, an engaging device 60, and a resistive leakage current detector 70.

First, the electrical configuration of the resistive leakage current detector 70 according to the present invention illustrated in FIG. 1 will be described.

The resistive leakage current detector 70 includes a current detector 71, a voltage detector 72, a power calculator 73, a phase difference calculator 74, and a resistive leakage current extractor 75.

The current detector 71 detects the resultant leakage current of the branch lines using the ZCT provided on the branch lines connected to the branch circuit breaker 20.

The voltage detector 72 detects voltage of the branch lines.

The power calculator 73 calculates the apparent power and the effective power as power components using the resultant leakage current of the current detector 71 and the voltage of the voltage detector 72.

The phase difference calculator 74 calculates the phase difference between the leakage current and the voltage using the power components of the power calculator 73.

The resistive leakage current extractor 75 extracts the resistive leakage current from the resultant leakage current of the current detector 71 using the phase difference of the phase difference calculator 74.

When the magnitude of the resistive leakage current detected by the resistive leakage current extractor 75 is greater than the reference magnitude, the branch circuit breaker 20 is triggered (i.e., turned off), thereby causing the power supply to the branch lines to be cut off.

The resultant leakage current and voltage detected by the current detector 71 and the voltage detector 72, respectively, are sampled through the A/D converter and input to the power calculator 73.

The power calculator 73 multiplies the sampled resultant leakage current and voltage together and calculates the power by integration thereof.

The components of electric power are composed of apparent power S, effective power P, and reactive power Q, and have a relationship of [$S = P + jQ$.]

The manner whereby the power calculator 73 calculates the power will be described with reference to FIG. 2.

Figure 2:
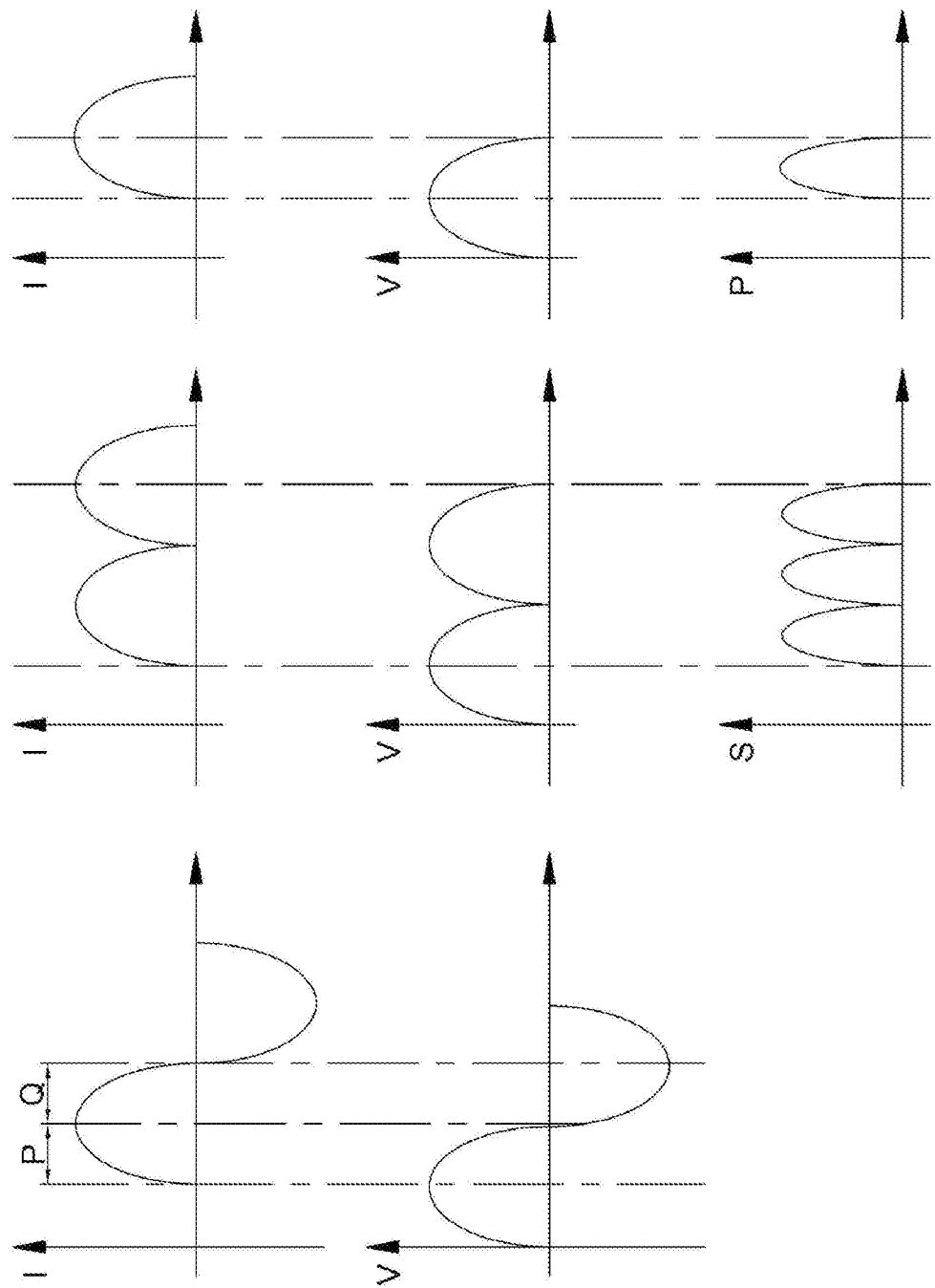
FIG. 2 is a view for explaining a method of calculating apparent electric power and effective electric power.

In the first drawing of FIG. 2, as an example, waveforms of the resultant leakage current I and the voltage V are illustrated for one cycle, respectively. With the positive (+) component for the half cycle of the resultant leakage current I as the reference, the region of positive (+) component of the voltage V as the same component corresponds to the effective power P, and the region of the negative (−) component of the voltage V as the different component corresponds to the reactive power Q.

With reference to a second drawing of FIG. 2, the power calculator 73 converts the negative (−) component of the resultant leakage current I and the negative (−) component of the voltage V into the (+) component of opposite direction, respectively, and the resultant leakage current I and the voltage V are multiplied and integrated thereafter. The integrated value corresponds to the apparent power S.

With reference to a third drawing of FIG. 2, the power calculator 73 removes the negative (−) component of the resultant leakage current I and the negative (−) component of the voltage V, and multiplies and integrates the resultant leakage current I and the voltage V thereafter. The integrated value corresponds to the effective power P. For reference, the removal of the negative (−) component may be established by actually removing the negative (−) component, or the negative (−) component may be removed by ignoring it (i.e., being treated as zero) when multiplied.

The phase difference calculator 74 applies the apparent power S and the effective power P computed by the power calculator 73 to the expression of $P = S \times \cos\theta$ and calculates the phase difference $\theta$ of the leakage current I and the voltage V.

For reference, in FIG. 2, since the apparent power S is calculated for one cycle and the effective power P is calculated for a half cycle, the effective power P should be doubled.

The resistive leakage current extractor 75 applies the phase difference $\theta$ calculated by the phase difference calculator 74 and the resultant leakage current I detected by the current detector 71 to the expression of $I = I_{gr} \times \cos\theta$, thereby extracting the resistive leakage current $I_{gr}$.

The resistive leakage current detection module 70 may be embedded in the branch circuit breaker 20 or embedded in the electric meter 40.

Hereinafter, with reference to FIGS. 3 to 6, the structures of the main circuit breaker 10, the branch circuit breakers 20, the enclosure 50, and the like will be described below.

The main circuit breaker 10 receives commercial power through an input side thereof connected to input power supply lines and applies commercial power through an output side thereof to branch circuit breakers 20, wherein busbars 30 are connected between the output side of the main circuit breaker 10 and the branch circuit breakers 20 to supply the commercial power.

The main circuit breaker 10 prevents an electric accident by blocking the lead-in power supply lines when an overvoltage such as a surge voltage is supplied through the lead-in power supply lines 1 or an overload is applied to the load side.

The output sides of the branch circuit breakers 20 connected correspondingly to power supply branch lines supply power to the loads, and the input sides of the branch circuit breakers 20 connected correspondingly to lead-in bars 33 of the busbars 30 receive power supply branching out from the busbars 30.

The branch circuit breakers 20 prevent electric accidents by blocking the power supply branch lines 3 when an overload is applied to or a short circuit occurs in the load sides.

The busbars 30 include lead-out busbars 31 drawn out from the main circuit breaker 10 and a plurality of lead-in busbars 33 branching out from the lead-out busbars 31 and entering into the branch circuit breakers 20.

The electric meter 40 measures the electric power consumed by each load and the electric power consumed by the entire loads through each branch circuit breaker 20, detects a short circuit, and calculates electric rates.

Figure 3:
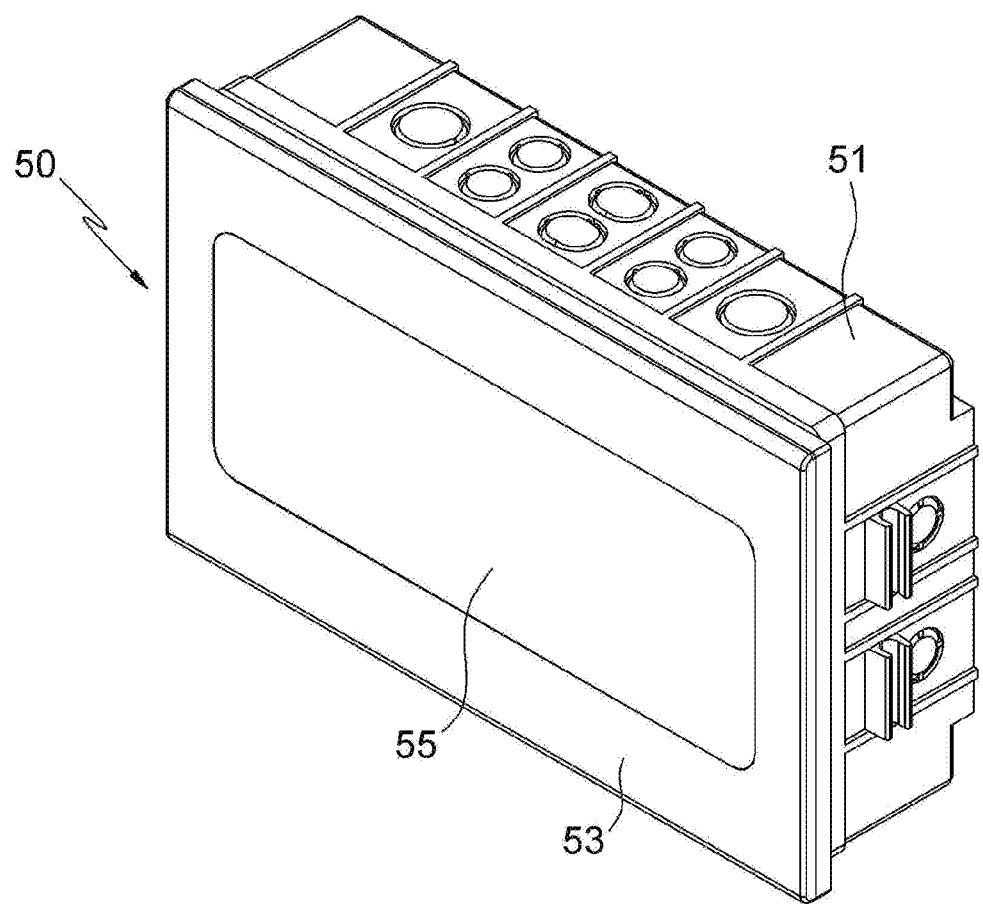
FIG. 3 is a perspective view of a power distribution box equipped with a resistive leakage current detector according to the present invention.
Figure 4:
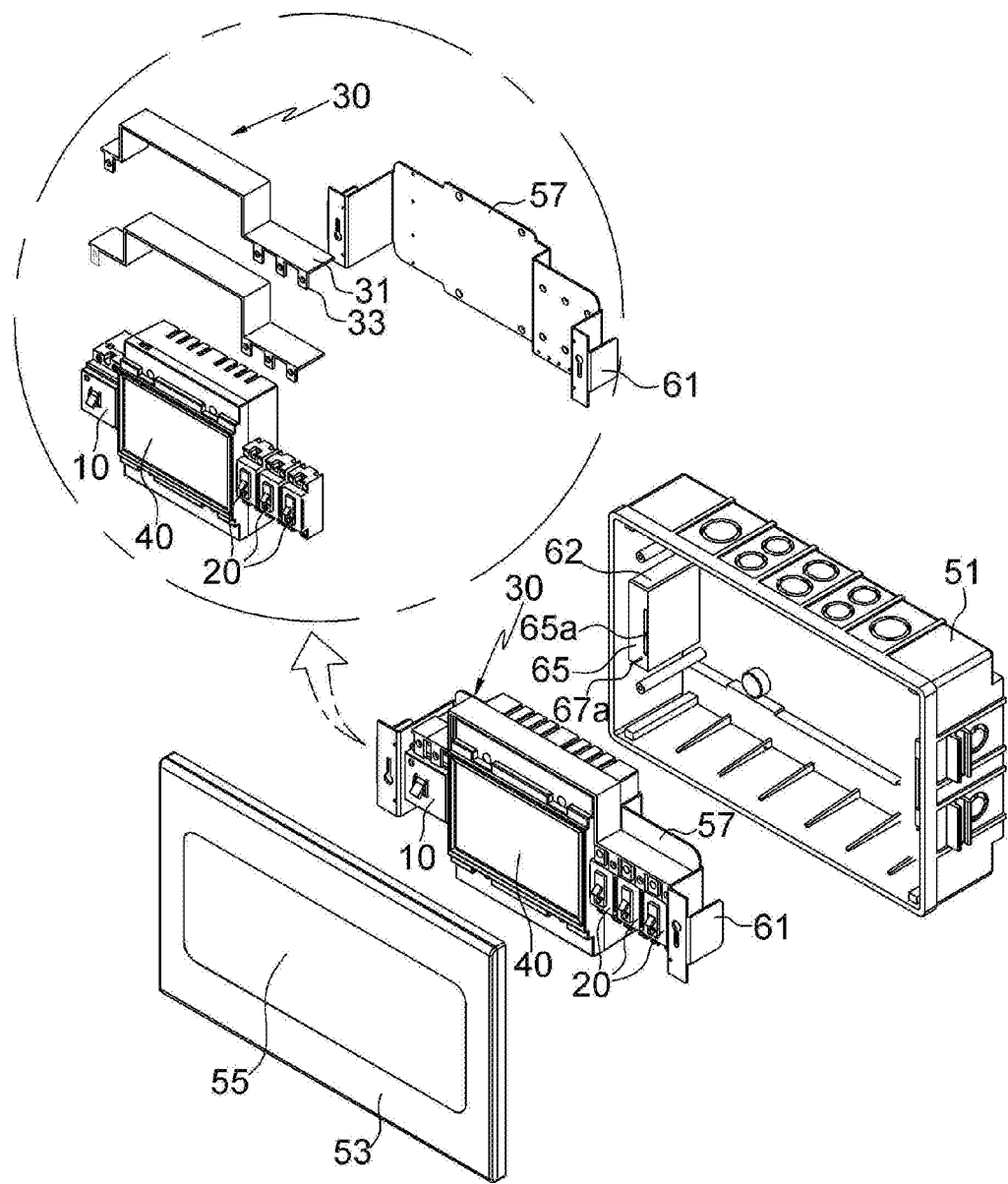
FIG. 4 is an exploded perspective view of FIG. 3.

With reference to FIGS. 3 and 4, the enclosure 50 includes a casing 51, a door 53, and a bracket 57.

The casing 51 is equipped with the bracket 57 and the main circuit breaker 10, and the like therein, and the door 53 is openably and closably coupled to the opening of the casing 51, and the door 53 is provided with a viewing window 55, thereby allowing the inside of the casing 51 to be seen through.

Because the internal space of the casing 51 is narrow, installing or disassembling operation of the main circuit breaker 10, the plurality of branch circuit breakers 20, the electric meter 40, and so on is inconvenient and takes a long time.

Therefore, the present invention introduces the bracket 57, and the main circuit breaker 10, the plurality of branch circuit breakers 20, the electric meter 40, and the like are installed on the bracket 57 outside the casing 51, thereby allowing the bracket 57 to be easily coupled to the inside of the casing 51 through the engaging device 60.

The bracket 57 is foiled in a U-shaped cross section, and equipped with the main circuit breaker 10, the plurality of branch circuit breakers 20, and the electric meter 40, wherein the main circuit breaker 10 and the plurality of branch circuit breakers 20 are connected by the busbars 30.

The engaging device 60 allows the bracket 57 to be easily engaged with and detached from the casing 51 without fastening tools such as a screwdriver, a bolt, and the like.

Figure 5:
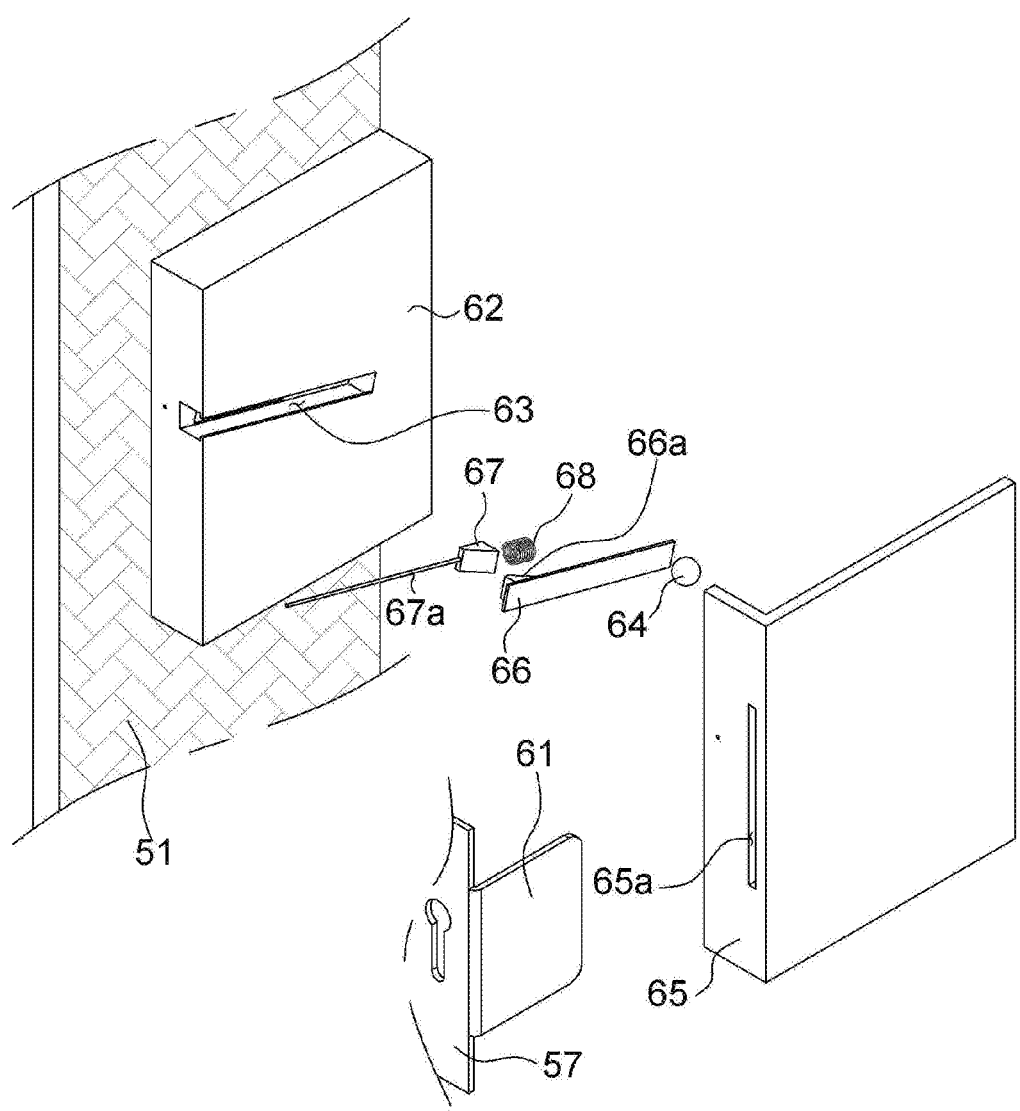
FIG. 5 is a perspective view showing an engaging device as a main part.

With reference to FIG. 5, the engaging device 60 includes:
an engaging plate 61 provided on both sides of the bracket in the forward and backward directions 57;
an engaging block 62 coupled to both side inner walls of the casing 51;
a guide groove 63 formed in the front and rear directions on the surface of the engaging block 62;
a depth adjustment plate 66 disposed at the bottom of the guide groove 63 and adjusting the depth of the guide groove 63 to become deeper toward the rear;
an engaging ball 64 moving along the guide groove 63; and
a cover 65 covering the engaging block 62.

It is preferable that the guide groove 63 has a front side positioned lower than the rear side thereof, thereby allowing the engaging ball 64 located in the guide groove 63 to be moved forward by its own weight.

The cover 65 is formed with an insertion hole 65a through which the engaging plate 61 is inserted and moved in the front and rear directions. In addition, the cover 65 covers the engaging block 62 to be spaced apart by a predetermined distance therefrom, thereby allowing the engaging plate 61 to be inserted into the space provided between the cover 65 and the engaging block 62 and preventing the engaging ball 64 from being separated and detached from the guide groove 63.

A sloped inclined-portion 66a protrudes from and is formed on the inner surface of the front side of the depth adjustment plate 66, and an inclined block 67 having an inclined plane corresponding to the inclined plane of the inclined-portion 66a is seated movably in front and rear directions at a forward-backward groove 63a formed on the bottom of the guide groove 63.

The inclined block 67 is elastically supported from the rear thereof by a spring 68 in the forward-backward groove 63a and normally pushes the inclined portion 66a by being moved forward. Thus, the front side of the depth adjustment plate 66 is raised from the bottom of the guide groove 63, whereby the guide groove 63 increases in depth in a direction from the front to the rear.

A lever 67a is connected to the front of the inclined block 67 and exposed passing through the engaging block 62 and the cover 65.

When the exposed lever 67a is pressed, the inclined block is moved backward in the forward-backward groove 63a, thereby allowing the front side of the depth control plate 66 to be lowered to the bottom.

The engaging ball 64 and the engaging plate 61 preferably have a strong frictional force, whereby engagement by the engaging ball 64 is prevented from being arbitrarily released.

The process of coupling and separating the bracket 57 and the casing 51 through the engaging device 60 composed as described above will be described with reference to FIG. 5.

When the bracket 57 is engaged with the casing 51, first, the engaging plate 61 of the bracket 57 is inserted into the insertion hole 65a of the cover 65 and pushed.

Figure 6:
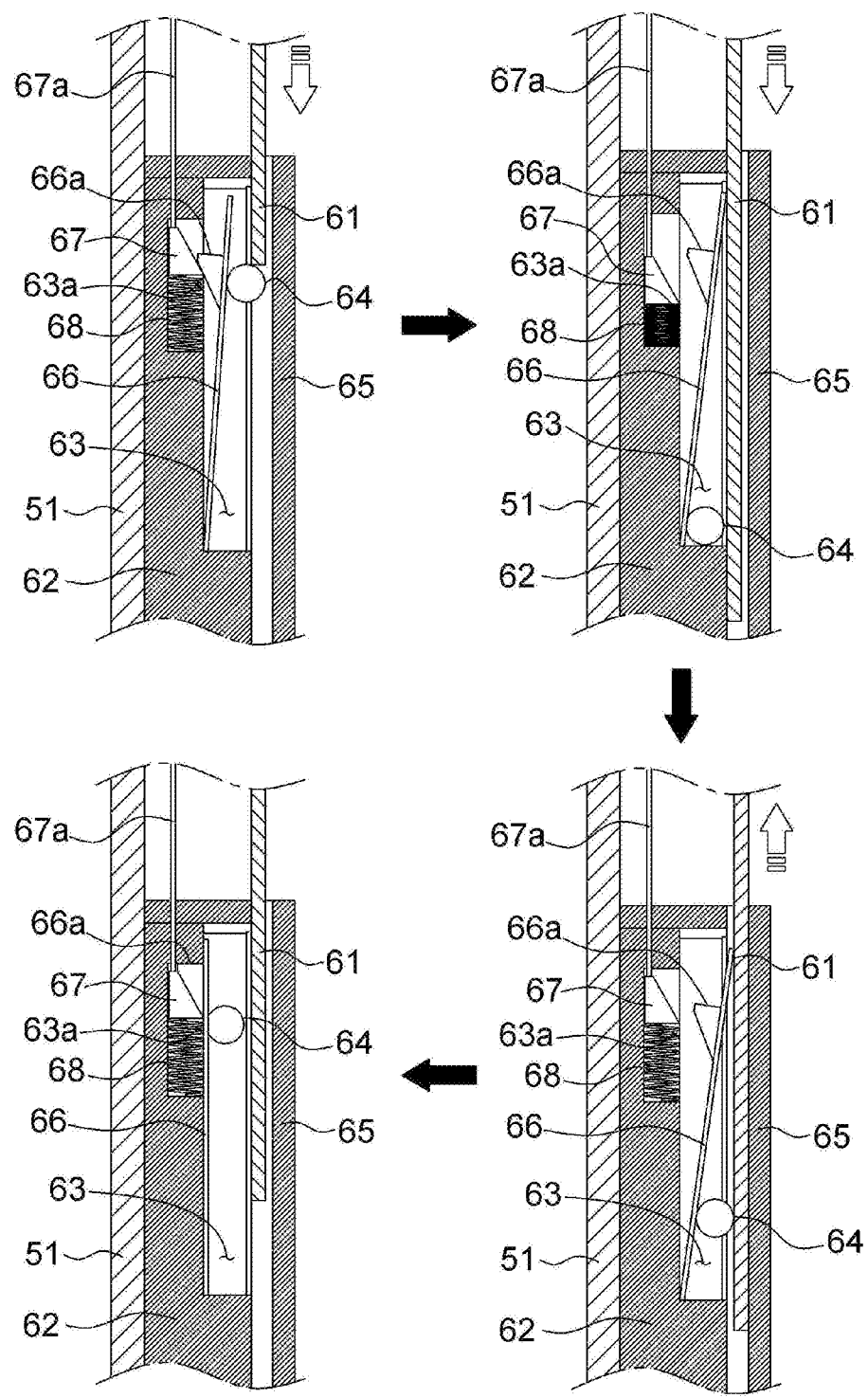
FIG. 6 is a view explaining a process in which the bracket and the casing are assembled or disassembled by the engaging device.

With reference to a first drawing of FIG. 6, the engaging plate 61 inserted into the insertion hole 65a enters into a gap between the engaging block 62 and the cover 65 and moves rearward, and the engaging ball 64 comes into contact with and pushed rearward by the end of the engaging plate 61 moving rearward, wherein, with reference to a second drawing of FIG. 6, as the guide groove 63 is deepened in a rearward direction, the engaging ball 64 moves reward along the guide groove 63 without particular resistance, whereby movement of the engaging plate 61 is allowed.

The engaging plate 61 is moved rearward further beyond the engaging ball 64 while the engaging ball 64 is stopped at the rear end of the guide groove 63.

When the movement of the engaging plate 61 in a rearward direction is completed, the engaging ball 64 moves forward along the guide groove 63 due to its own weight and stops at a position where it contacts with the engaging plate 61.

With reference to a third drawing of FIG. 6, when the bracket 57 is pulled, that is, when the engaging plate 61 is moved forward, the engaging ball 64 moves forward along the guide groove 63 by the frictional force. Since the guide groove 63 has a depth decreasing in a forward direction, when the engaging ball 64 moving forward presses and pushes the engaging plate 61, the engaging plate 61 being pushed presses the cover 65 and is brought into close contact therewith. As the engaging ball 64 moves closer to the front of the guide groove 63, the pressing force becomes stronger.

As described above, the engaging plate 61 is inserted into a gap between the engaging block 62 and the cover 65 through the input hole 65a without particular resistance, thereby coupling the bracket 57 and the casing 51 to each other. In a state when coupling is completed, when the engaging plate 61 is even slightly displaced from the insertion hole 65a, the engaging ball 64 strongly presses the engaging plate 61, thereby preventing the engaging plate 61 from being detached and separated.

When the bracket 57 is to be separated from the casing 51, the lever 67a is pressed and the bracket 57 is pulled out. With reference to a fourth drawing of FIG. 5, when the lever 67a is pressed, the front side of the depth adjustment plate 66 is lowered, thereby causing the front side depth of the guide groove 63 to be deepened. Accordingly, the engaging ball enters into the guide groove 63 and leaves the engaging plate 61 not to be pressed, whereby the engaging plate 61 is separated without particular resistance.

While the power distribution box equipped with the resistive leakage current detector having the specific configuration and structure has been described with reference to the accompanying drawings for the description of the present invention, it is to be understood that the present invention has been described in connection with what is presently considered to be various modifications and variations. Accordingly, those various modifications and variations should be construed as falling within the scope of protection of the present invention.

What is claimed is:

1. A power distribution box equipped with a resistive leakage current detector, the power distribution box comprising:
   a main circuit breaker supplied with commercial power;
   a plurality of branch circuit breakers connected to respective loads and applying the power supplied from the main circuit breaker to corresponding loads;
   a current detector detecting a resultant leakage current of branch lines connected to the branch circuit breaker;
   a voltage detector detecting voltage of the branch lines;
   a power calculator calculating the power using the resultant leakage current of the current detector and the voltage of the voltage detector;
   a phase difference calculator calculating a phase difference using power components of the power calculator; and
   a resistive leakage current extractor extracting a resistive leakage current from the resultant leakage current of the current detector using the phase difference of the phase difference calculator, wherein the power calculator calculates:
   apparent power by multiplying the resultant leakage current and the voltage after converting a (−) component of the resultant leakage current of the current detector and a (−) component of the voltage of the voltage detector into a (+) component of opposite direction, respectively, and
   effective power by multiplying the resultant leakage current and the voltage after removing the (−) component of the resultant leakage current of the current detector and the (−) component of the voltage of the voltage detector.

2. The power distribution box of claim 1, further comprising:
   a bracket mounted with the main circuit breaker, the branch circuit breakers, and the electric meter;
   a casing enclosing the bracket,
   a door openably and closably covering an opening of the casing; and
   an enclosure including a transparent window provided on the door and allowing the inside of the casing to be seen therethrough.

3. The power distribution box of claim 2, further comprising:
   an engaging plate provided on both sides of the bracket in the forward and backward directions;
   an engaging block coupled to both side inner walls of the casing;
   a guide groove formed in the front and rear directions on the surface of the engaging block and becoming deeper toward the rear;
   an engaging ball moving along the guide groove;
   a cover covering the engaging block; and
   an engaging device that is operated such that when the engaging plate enters into a gap between the engaging block and the cover and moves rearward, the engaging ball is brought into contact with the engaging plate and pushed rearward along the guide groove, thereby allowing the engaging plate to advance, and when the engaging plate moves forward, the engaging ball brought into contact with the engaging plate moves forward along the guide groove, thereby allowing the engaging plate not to move backwards by pressing a surface of the engaging plate.

* * * * *